US 9,093,782 B2

(12) United States Patent
Wang et al.

(10) Patent No.: US 9,093,782 B2
(45) Date of Patent: Jul. 28, 2015

(54) SHIELD CONNECTOR STRUCTURE

(71) Applicant: Yazaki Corporation, Tokyo (JP)

(72) Inventors: Feng Wang, Kakegawa (JP); Yuki Hiruta, Kakegawa (JP)

(73) Assignee: Yazaki Corporation, Tokyo (JP)

( * ) Notice: Subject to any disclaimer, the term of this patent is extended or adjusted under 35 U.S.C. 154(b) by 32 days.

(21) Appl. No.: 14/027,487

(22) Filed: Sep. 16, 2013

(65) Prior Publication Data

US 2014/0080355 A1 Mar. 20, 2014

(30) Foreign Application Priority Data

Sep. 18, 2012 (JP) ................................ 2012-204079

(51) Int. Cl.
| | |
|---|---|
| *H01R 13/621* | (2006.01) |
| *H01R 13/74* | (2006.01) |
| *H02G 3/06* | (2006.01) |
| *H01R 13/641* | (2006.01) |
| *H01R 13/6592* | (2011.01) |
| *H01R 13/6596* | (2011.01) |
| *H05K 9/00* | (2006.01) |

(52) U.S. Cl.
CPC ............ *H01R 13/621* (2013.01); *H01R 13/641* (2013.01); *H01R 13/6592* (2013.01); *H01R 13/6596* (2013.01); *H01R 13/74* (2013.01); *H01R 13/748* (2013.01); *H02G 3/0666* (2013.01); *H05K 9/0018* (2013.01)

(58) Field of Classification Search
CPC ..... H01R 13/648; H01R 13/74; H01R 13/641
USPC ............ 439/97, 98, 101, 105, 548, 556, 559, 439/564, 587, 607.41, 607.44, 589, 489, 439/680, 681
See application file for complete search history.

(56) References Cited

U.S. PATENT DOCUMENTS

| | | | |
|---|---|---|---|
| 6,280,208 B1 | 8/2001 | Masuda et al. | |
| 6,688,896 B2 * | 2/2004 | Matsumoto | ..................... 439/98 |
| 7,097,514 B2 * | 8/2006 | Ishizaki et al. | ................ 439/681 |

FOREIGN PATENT DOCUMENTS

| | | |
|---|---|---|
| JP | 2000-294344 A | 10/2000 |
| WO | WO 2012029996 A1 * | 3/2012 |

* cited by examiner

*Primary Examiner* — Felix O Figueroa
*Assistant Examiner* — Paul Baillargeon
(74) *Attorney, Agent, or Firm* — Locke Lord LLP

(57) ABSTRACT

Disclosed is a shield connector structure preventing improper connection of a shield electric wire. The shield connector includes a housing fixed to an outer face of a metal case and a shield member connecting a shield part of the shield electric wire and the metal case, on one of the outer face of the metal case and an opposite face of the housing is formed a pin (projection) projecting toward the other, on the other are formed a positioning hole receiving the pin and a recess, the recess includes a slant face slanted in a peripheral direction about a center axis of an insertion hole, and abutting of the pin of the improper combination onto the slant face rotates a bolt hole of the metal case and a through hole of the housing about the center axis, making it impossible for a bolt to thread into.

4 Claims, 7 Drawing Sheets

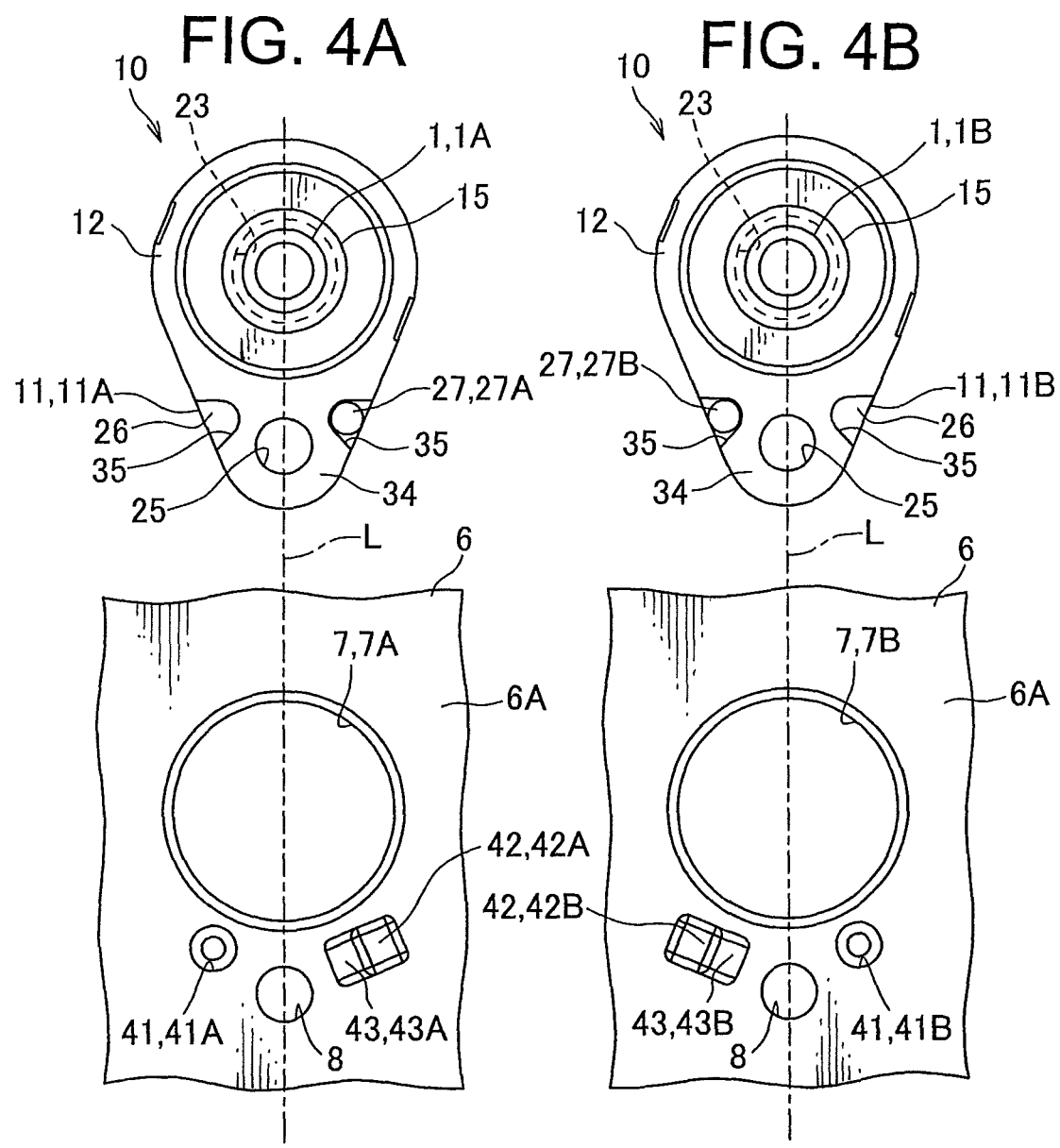

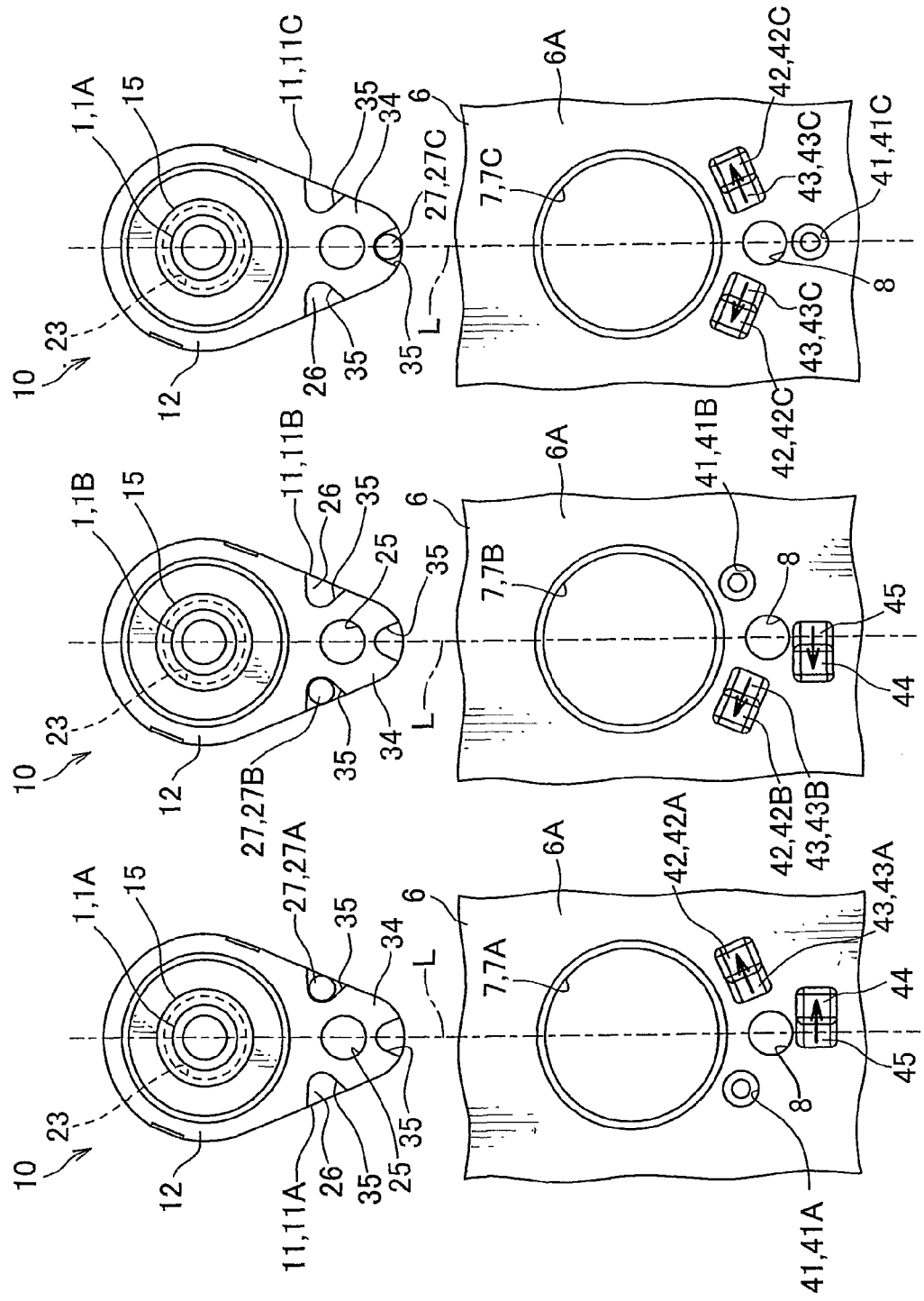

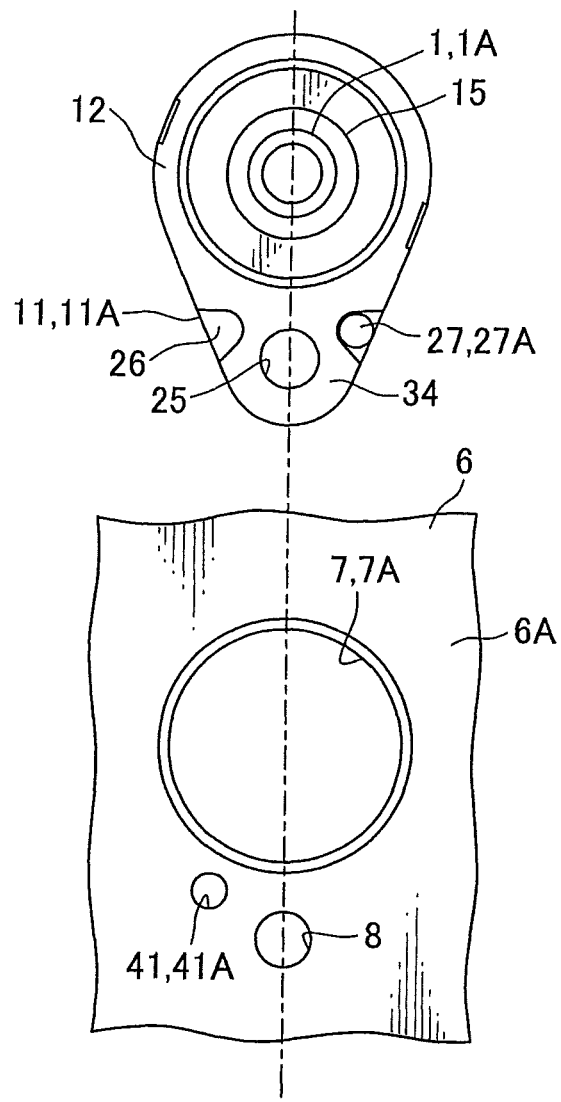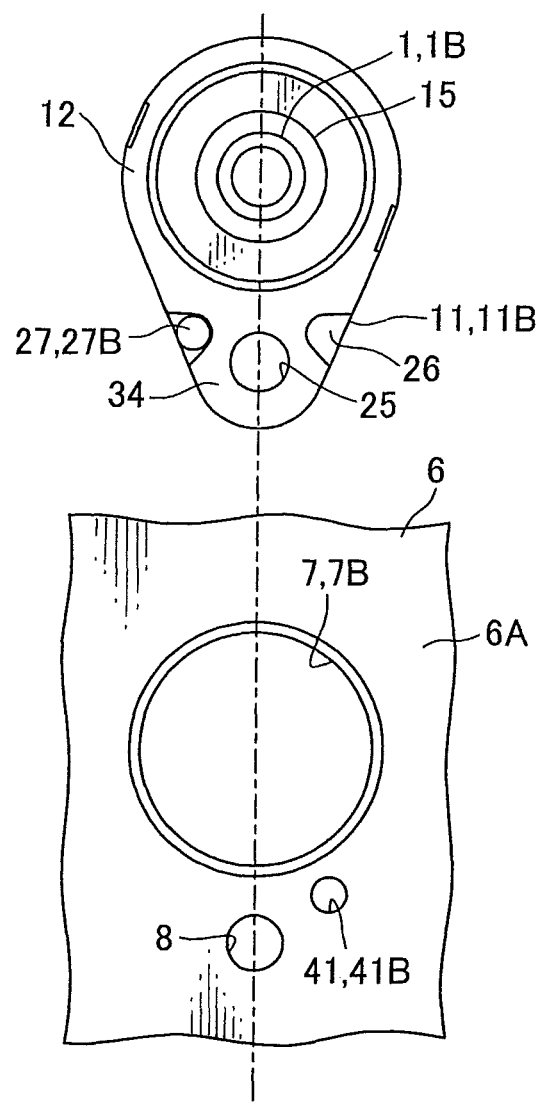

SHIELD CONNECTOR STRUCTURE

CROSS REFERENCE TO RELATED APPLICATION

The priority application Japan Patent Application No. 2012-204079 upon which this patent application is based is hereby incorporated by reference.

TECHNICAL FIELD

This invention relates to shield connector structures, particularly to shield connector structures for connecting shield electric wires passed through from one end to the other end of connection objects to the connection objects.

BACKGROUND ART

Conventionally, in automobiles (especially electric vehicles or hybrid vehicles) devices such as motors, batteries or inverters are each connected with each other with shield electric wires and there have been advocated shield connector structures for connecting the shield connectors and cases of the devices for ground-connection (for example see PTL 1). The shield connector 10 recited in the reference 1 is, as shown in FIG. 1, designed to connect a shield electric wire 1 with a metal case 6 of a connection object and to keep waterproof at connection section. The shield electric wire 1 is a coaxial cable including a conductor 2, an inner insulating cover 3 covering the conductor 2, and a shield part 4 composed of a conductor such as a braid disposed around the inner insulating cover 3, and an outer insulating cover 5 covering the side of the shield section 4. The metal case 6 is provided with an insertion hole 7 passing therethrough the shield electric wire 1, and a bolt hole 8 into which a bolt 16 fixing the housing 11 threads.

This shield connector 10 is provided with a housing 11 passing therethrough the shield electric wire and fixed to the metal case 6 as well, a shield member 12 electrically connecting the shield section 4 of the shield electric wire 1 and the metal case 6, a first seal member 13 inserted in between an inside of the shield member 12 and an outside of the outer insulating cover 5 of the shield electric wire 1, a second member 14 inserted into between an outside of the shield member 12 and an inside of the insertion hole 7 of the metal case 6, a shield pipe 15 covering the shield case 4 connected with the shield member 12 and swaged, and a bolt 16 fixing the housing to the metal case 6.

The housing 11 is what is fixed to one side (outer side) of the metal case 6 and holds the shied member 12 inserted into between the metal case 6 and itself and is provided with a housing main body 21, a flange (fixing part) 22 fixed to the metal case 6, an electric wire guide 23 passing therethrough the shield electric wire 1, and a tubular projection 24 further projecting over the other side (inner side) of the metal case 6 than the electric wire guide 23. The shield member 12 is provided with a first tubular part 31 with its diameter enlarging in three steps toward the one side from the other side of the metal case 6, a second tubular part 32, a third tubular part 33, and a flange 34 bent in continuous with the third tubular part 33 and following the one side (outer side) of the metal case 6. The first tubular part 31 is connected to the shield part 4 of the shield electric wire 1, the flange 34 is held between the outer side 6A or the one side of the metal case 6 and an opposite face 26 of the housing 11 as well, and thereby the shield part 4 is in ground connection with the metal case 6 through the shield member 12.

In the shield connector 10 as mentioned above, the shield electric wire 1 is passed through the electric wire guide 23, the shield member 12, the first shield member 13 and the second shield member 14 are mounted, the shield pipe 15 is swaged, and thereby to an end of the shield electric wire 1 the housing 11 or the shield member 12 is mounted. This shield electric wire 1 is inserted into the insertion hole 7 of the metal case 6 from the end side (a side of the terminal fitting 9 shown in FIGS. 2 and 3), a bolt 16 passed through the through hole 25 of the flange 22 is threaded into the a bolt hole 8 of the metal case 6, and thus the housing 11 is fixed to the metal case 6, the flange 34 of the shield member 12 is abutted onto an outside 6A of the metal case 6 as well, allowing the shield member 4 of the shield electric wire 1 to be electrically connected with the metal case 6 through the shield member 12, and the shield connector 10 is completed.

However, as the shield electric wire 1 various types such as what is for direct current power source or for three-phase AC source are employed, and thereby it is necessary to discriminate from other shield electric wire and connect with the metal case 6. Thereby, as shown in FIG. 8, there has been advocated a configuration in which a preventive pin of improper connection (projection) 27 is formed in the flange 22 of the housing 11, on the outside 6A of the metal case 6 is formed a positioning hole 41 operable to receive the pin 27, and it is made possible to determine improper connection when the outside 6A of the metal case 6, without the pin 27 being not inserted into the positioning hole 41, is abutted onto the pin 27. Particularly, for example, when as the shield electric wires 1 each connected to the two electrodes (P-pole and N-pole) in DC power source such as battery are employed a shield electric wire 1A for P-pole shown in FIG. 8A and a shield electric wire 1B for N-pole shown in FIG. 8B, to an end of the shield electric wire 1A a housing 11A (a first housing) is attached, to an end of the shield electric wire 1B a housing 11B (a second housing).

In the housing 11A for the P-pole the first pin 27 (the first projection) that is a projection projecting from an opposite face 26 of the flange 22 is formed deviating to the right side when the opposite face 26 is viewed. On the other hand, in the metal case 6 to which this housing 11A is fixed, the first positioning hole 41A that is a positioning hole disposed near the insertion hole 7 into which the shield electric wire 1A for the P-pole is inserted is formed deviating to the left side when the outside 6A of the metal case 6 is viewed. Namely, the opposite face 26 of the housing 11A is made opposed to the outside 6A of the metal case 6, and when the end of the shield electric wire 1A is inserted into the insertion hole for the P-pole, the first pin 27A is inserted into the first positioning hole 41A, and the through hole 25 of the housing 11A and the bolt hole 8 of the metal case 6 are overlaid as well, therefore allowing the bolt 16 to thread into the bolt hole 8 via this insertion hole 25. The second pin 26B (the second projection) that is a projection in the housing 11B for the N-pole is formed deviating to the left side when the opposite face 26 is viewed, the second positioning hole 41B that is a positioning hole near the insertion hole 7B for the N-pole in the metal case 6 is formed deviating to the right side when the outside face 6A is viewed, the bolt 16 is, with the second pin 27B inserted in the second positioning hole 41B, configured to thread into the bolt hole 8 via the through hole 25 of the housing 11B.

On the other hand, when the shield electric wire 1A for the P-pole attached to the housing 11A is inserted into the insertion hole for the N-pole or when the shield electric wire 1B for the N-pole attached to the housing 11B is inserted into the insertion hole 7A for the P-pole, the first pin 27A and the second pin 27B cannot be inserted into the first positioning hole 41A and the second positioning hole 41B, respectively, consequently abutting onto the outside 6A of the metal case 6. Therefore, since between the outside 6A of the metal case 6 and the opposite face 26 of the housing 11 is formed a space, it is made possible for the operator who works connecting the shield electric wire 1 to find improper connection and to thereby prevent improper connection of the shield electric wire 1.

CITATION LIST

Patent Literature

[PTL 1]
Japanese Patent Application Laid-Open Publication No. 2000-294344

SUMMARY OF INVENTION

Technical Problem

Disadvantageously, in the shield connector structure including the structure for conventional improper connection prevention, when the operator, even though a space is formed between the outside 6A of the metal case 6 and the opposite face 26 of the housing 11, without finding the space, works fastening of the bolt 16, it was possible to fix the housing 11 that was an improper combination and was difficult securely to prevent improper connection of the shield electric wire 1. Particularly as shown in FIGS. 9A and 9B, even though the pin 27 is not inserted into the positioning hole 41 and abutting onto the outside 6A of the metal case 6 forms a space S, if the through hole 25 of the housing 11 and the bolt hole 8 of the metal case 6 are positioned to overlap to each other, the bolt 16 may be threaded into the bolt hole 8 via the through hole 25, making it likely to fix the housing to the metal case 6 that is improper combination. Therefore, it has been desired to develop improper connection prevention structures for further securely preventing improper connection of the shield electric wire 1.

Therefore, an object of the present invention is, in view of the above, to provide a shield connector structure capable of further securely preventing improper connection for a shield electric wire.

Solution to Problem

In order to resolve the aforementioned problems, a shield connector structure according to one aspect of the invention is configured to connect a shield electric wire with a connection object by passing through the shield electric wire from one end to the other end of an insertion hole of the connection object, which the shield electric wire includes a conductor, an inner insulating cover, a shield part, and an outer insulating cover, the shield connector structure comprising: a housing passing therethrough the shield electric wire and fixed to one face of the connection object and including an opposite face opposed to the one face of the connection object and a through hole; a shield member electrically connecting the shield part of the shield electric wire and the connection object; and a bolt passing through the through hole and fixing the housing to the connection object by its passing through the housing and threading into a bolt hole of the connection object, wherein one of the one face of the connection object and the opposite face of the housing is provided with a projection projecting toward the other of the connection object and the opposite face of the housing, wherein the other of the connection object and the opposite face of the housing is provided with a positioning hole receiving the projection with the bolt operable to thread into the bolt hole and a recess recessed from the one of the connection object and the opposite face of the housing, wherein the recess includes a slant face along a circumferential direction about center axis of the insertion hole of the connection object and slanted in a recess direction, and wherein upon improper combination of the connection object and the housing, abutting of the projection of the improper combination onto the slant face allows the bolt hole of the connection object and the through hole of the housing to rotate about the center axis.

Preferably, in the shield connector structure, the housing includes a tubular electric wire guide passing therethrough from one end to the other end thereof the shield electric wire and extending into the insertion hole of the connection object, and is composed of either a first housing passing through a predetermined type of the shield electric wire or a second housing passing through a different type of the shield electric wire from the predetermined type, and wherein on the opposite face of the first housing is formed a first projection as the projection deviating from a line connecting centers of the electric wire guide and the through hole to one side when the opposite face is viewed, on the opposite face of the second housing is formed a second projection as the projection deviating from the line connecting centers of the electric wire guide and the through hole to the other side opposite to the first projection when the opposite face is viewed, and on the one face of the connection object are formed the positioning hole and the slant face of the recess at line-symmetry positions when the one face of the connection object is viewed crossing the line connecting centers of the insertion hole and the bolt hole, or on the opposite face of the first housing are formed the positioning hole on one side of line-symmetry sides when the opposite face is viewed crossing the line connecting centers of the electric wire guide and the through hole and the slant face of the recess on the other side of line-symmetry sides, on the opposite face of the second housing are formed the slant face of the recess on one side of line symmetry sides when the opposite face is viewed crossing the line connecting centers of the electric wire guide and the through hole and the positioning hole on the other side of line symmetry sides, and on the one face of the connection object is formed the objection deviating from the line connecting centers of the insertion hole and the bolt hole.

Preferably, the shield member is placed between the one face of the connection object and the opposite face of the housing so as to be electrically connected and is configured to form therein a pair of notches passing therethrough both the projection and the projection of improper combination.

Advantageous Effects of Invention

According to the one aspect of the invention, since the projection is formed in one of the one face of the connection object and the opposite face of the housing and projecting toward the other, a positioning hole and a recess are formed in the other, the recess includes a slant face, the projection is abutted onto the slant face upon improper combination, and the bolt hole of the connection object and the through hole of the housing rotate about the center axis, it is made impossible for the bolt passed through the through hole to thread into the bolt hole. Therefore, even though the shield electric wire that lies in improper combination respective to the insertion hole of the connection object is passed through to fix the housing in the improper combination, it is impossible for the bolt to thread into the bolt hole, and thus it is made impossible to continue fixing work, making it possible for the operator to find improper combination, and further securely preventing improper connection of the shield electric wire.

According to the present invention, the first projection of the first housing and the second projection of the second housing are disposed at line symmetry positions crossing the line connecting centers of housings, on the one side of the connection object the positioning hole and the slant face of the recess are formed corresponding to these first projection and the second projection as well, or the positioning hole and the slant face of the recess are formed at line symmetry positions crossing the line connecting centers of first and second housings, on the one side of the connection object the projection is disposed deviating to one side or the other side relative to the center line. Therefore, since the projection, the positioning hole and the recess are formed symmetrically corresponding to the two types of shield electric wires, when fixing the housing corresponding to the one shield electric wire to the connection object of the improper combination, abutting the projection onto the slant face of the recess allows the bolt hole and the through hole securely to rotate so as to avoid the bolt threading into.

According to the present invention, since the pair of notches passing both the projection and the projection of the improper combination are formed to the shield member, it is made possible for the projections disposed at different positions corresponding to the two types of shield electric wires to each pass through the notches, allowing the shied member to be common to the two types of the shield electric wires. Note that types of the shield electric wires according to the present invention may not be limited to two, but three or more, projections are disposed at positions selected from three or more, and positioning hole corresponding to every type and recess corresponding to the other of a plurality of projections (two or more) (that is, projection of the improper combination) may be disposed.

BRIEF DESCRIPTION OF DRAWINGS

FIG. 4A is an elevational view illustrating improper connection prevention structure in the shield connector structure;

FIG. 4B is an elevational view illustrating an improper connection prevention structure in the shield connector structure;

FIG. 7A is an elevational view illustrating a shield connector according to a modification of the present invention;

FIG. 7B is an elevational view illustrating a shield connector according to the modification of the present invention;

FIG. 7C is an elevational view illustrating a shield connector according to the modification of the present invention;

FIG. 8A is an elevational view illustrating a shield connector structure according to a conventional art;

FIG. 8B is an elevational view illustrating a shield connector structure according to the conventional art;

DESCRIPTION OF EMBODIMENTS

With now reference to FIGS. 1 to 6 is discussed a shield connector structure according to one embodiment of the invention. The shield connector structure of the embodiment is what is used in automobiles, particularly in electric vehicles running by drive force of electric motors or hybrid vehicles running by both drive forces of combustion engine and electric motor, for connecting the shield electric wire 1 to ground when connecting between motors and inverters or between invertors and batteries with the shield electric wire 1.

Figure 1:
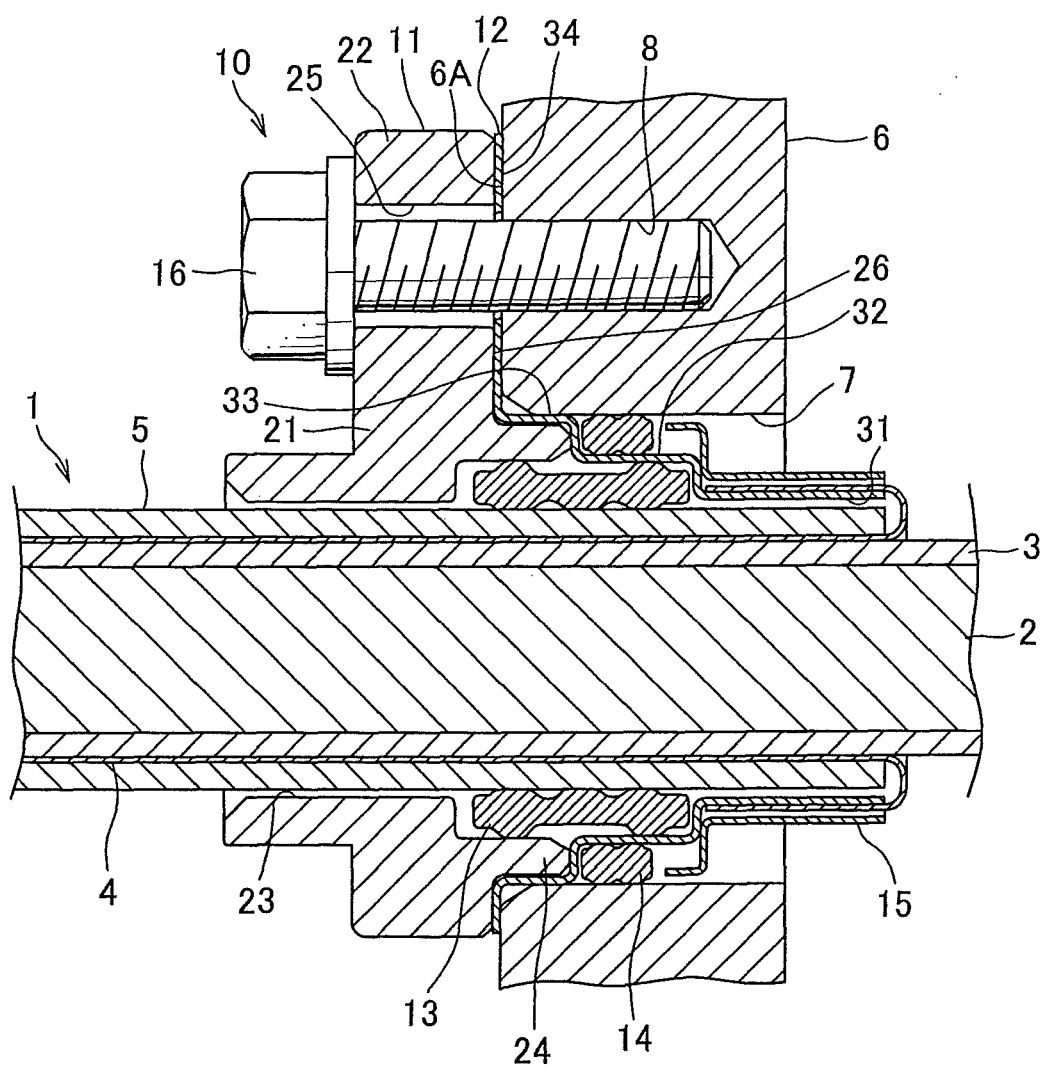
FIG. 1 is a cross-sectional view illustrating a shield connector structure according to one embodiment of the present invention.

As shown in FIG. 1, the shield electric wire 1 is a coaxial cable which includes a conductor 2 made of such as a braided wire in which a plurality of core wires is braided to be formed, an inner insulating cover 3 covering an outside of the conductor 2 and made of insulating synthetic resin, a shield part 4 disposed on an outside of the inner insulating cover 3 and made of such as braided conductor, an outer insulating cover 5 covering an outside of the shield part 4 and made of such insulating synthetic resin. Such a motor, an inverter, or a battery as a connection object, on the other hand, includes a metal case 6 composing its outer, which the metal case 6 is provided with an insertion hole 7 passing therethrough the shield electric wire 1.

The shield electric wire 1 is inserted from the outside (one side) into the inside (the other side) of the metal case 6 through the insertion hole 7, and at the tip of the inside of the conductor 2 a terminal 9 is fixed, which is connected to a not-shown electric connection part in the metal case 6. The shield part 4 of the shield electric wire 1 is made such that at its tip the outer insulating cover 5 is removed to be exposed, and is in ground-connection with the metal case 6 via the shield member 12, which the shield part 4 and the shield member 12 are designed to shield electro-magnetic wave and prevent noise from the connection part from leaking or penetrating.

A shield connector 10 is provided with a housing 11 arranged to insert thereinto the shield electric wire 1 and is fixed to the outside of the metal case 6, a conductive tubular shield member 12 connecting the shield part 4 of the shield electric wire 1 and the metal case 6, a first shield member 13 inserted in between the inner face of the shield member 12 and the outer face of the outer insulating cover of the shield electric wire 1, a second shield member 14 inserted in between the outer face of the shield member 12 and the inner face of the insertion hole 7 of the metal case 6, a ring-like shield pipe 15 swaging and fixing the shield part 4 of the shield electric wire 1 and the shield member 12, and a bolt 16 fixing the housing 11 to the metal case 6.

The housing 11 is a die-cast part integrally molded of metal such as aluminum alloy, and is provided with a housing 21 nipping and conducting the shield member 12 to an outer face 6A of the meal case 6, a flange 22 fixed to the metal case 6 from outside the metal case 6, an electric wire guide 23 passing the electric wire 1 through the housing 21, a tubular projection 24 extending from the housing main body 21 into the insertion hole 7 of the metal case 6 so as to be positioned inside the shield member 12, an insertion hole 25 passing through the flange 22 and passing therethrough the bolt 16. Note that the housing 11 may be made of, but not limited to metal material, such resin even capable of holding the shield member 12 or the shield member 13.

The shield member 12 is, as is similar to conventional one, provided with a first tubular part 31, a second tubular part 32, and a third tubular part 33, of which diameter enlarges in three steps from inside to outside of the metal case 6, and a flange 34 following the outer face 6A of the metal case 6. The first tubular part 31 is connected to the shield part 4 of the shield electric wire 1, the flange 34 is held between the outer face 6A of the metal case 6 and a opposite face 26 of the housing 11, and thereby the shield part 4 is in ground-connection with the metal case 6 via the shield member 12.

The first seal member 13 formed of elastic material such as rubber, is generally tubular-shaped, and is provided with three ring-like lips on its inside face and two ring-like lips on its outside face. The three ring-like lips on the inside face are closely contacted with outside face of the outer insulating cover 5 of the shield electric wire 1, the two ring-like lips on the outer face are closely contacted with inside face of the tubular projection 24 and inside face of the second tubular part 32 of the shield member 12, and thereby places between the shield electric wire 1, the housing 11 and the shield member 12 are made sealed.

The second seal member 14 formed of elastic material such as rubber, is generally tubular-shaped, and is provided with two ring-like lips on its inside face and outside face, which the ring-like lips on the inside face is closely contacted with outside face of the second tubular part 32, which the ring-like lips on the outer face is closely contacted with inside face of the insertion hole 7, and thereby place between the shield member 12 and the metal case 6 is made sealed. As mentioned above, from the outside face of the outer insulating cover 5 toward the inside face of the insertion hole 7 are subsequently arranged the first shield member 13, the tubular projection 24 of the housing 11 and the second tubular part 32 of the shield member 12, and the second seal member 14, which are closely contacted to each other, and thereby the shield electric wire 1 is made, with it waterproofed, connected to the metal case 6.

Then an improper connection prevention structure of the shield electric wire 1 is described with reference to FIGS. 4A to 6B. Note that as the shield electric wire 1 connected to two electrodes (N-electrode and P-electrode) of direct current power source such as battery, a shield electric wire 1A for the P-electrode and a shield electric wire 1B for the N-electrode are herein described. As shown in FIG. 8A, to an end of the shield electric wire 1A for the P-electrode is attached a first housing 11A as the housing 11, and the shield electric wire 1A is inserted into the insertion hole 7A for the P-electrode in the metal case 6. As shown in FIG. 8B, to an end of the shield electric wire 1B for the N-electrode, on the other hand, is attached a second housing 11B as the housing 11, and the shield electric wire 1B is inserted into the insertion hole 7B for the N-electrode in the metal case 6.

The first housing 11A and the second housing 11B have improper connection prevention pins (projections) 27 respectively projected from opposite face 26, a first pin (a first projection) 27A, that is, the pin 27 formed in the first housing 11A, is formed deviating to the right side in the figure respective to the opposite face 26, a second pin (a second projection) 27B, that is, the pin 27 formed in the second housing 11B, is formed deviating to the left side in the figure respective to the opposite face 26. Namely, the first pin 27A and the second pin 27B are formed at line symmetry positions crossing a center line L connecting centers of the electric wire guide 23 (shield electric wire) and the through hole 25. In the flange 34 of the shield member 25 is formed a pair of notches 35 passing therethrough both the first pin 27A and the second pin 27B.

In the outer face 6A of the metal case 6 are formed a positioning hole 41 capable of receiving the pin 27, a recess 42, in which the recess 42 a slant face 43 is formed arranged along a circumferential direction about center axis of the insertion hole 7 and slanted in a recess direction. Adjacent to the insertion hole 7A for P-electrode the first positioning hole 41A as the positioning hole 41 is formed deviating to the left side in the figure when the outer face 6A is viewed, and the first slant face 43A as the slant face 43 is formed slanted farther to the viewer toward diagonally upper right side in the figure. These first positioning hole 41A and the first slant face 43A are formed at line symmetry positions crossing the center line L connecting centers of the insertion hole 7A and the bolt hole 7B. Around the insertion hole 7B for the N-electrode the second positioning hole 41B as the positioning hole 41 is formed deviating to left side toward the outer face 6A in the figure when the outer face 6A is viewed, the second slant face 42B as the recess 42 is formed slanted farther to the viewer toward diagonally upper left side in the figure. These second slant face 41B and the second recess 42B are formed at line symmetry positions crossing the center line L, and the first positioning hole 41A and the first recess 42A are positioned mirror-reversely.

In the aforementioned improper connection prevention structure, when the shield electric wire 1A for the P-electrode is made inserted into the insertion hole for the P-electrode 7A, the first pin 27A is inserted into the first positioning hole 41A and the through hole 25 and the bolt hole 8 become arranged coaxially. Likewise, when the shield electric wire for the N-electrode 1B is made inserted into the insertion hole for the N-electrode 7B, the second pin 27B is inserted into the second positioning hole 41B and the through hole 25 and the bolt hole 8 become arranged coaxially. Therefore, the first housing 11A for P electrode 11A and the second housing for N-electrode 11B are each made fixed to the metal case 6 by threading the bolt 16 to the blot hole 8 via the through hole 25.

Figure 5A:
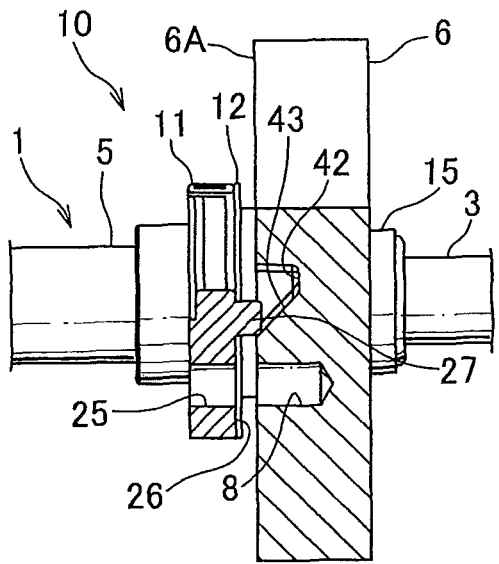
FIG. 5A is a cross-sectional view illustrating operation of an improper connection prevention structure.
Figure 5B:
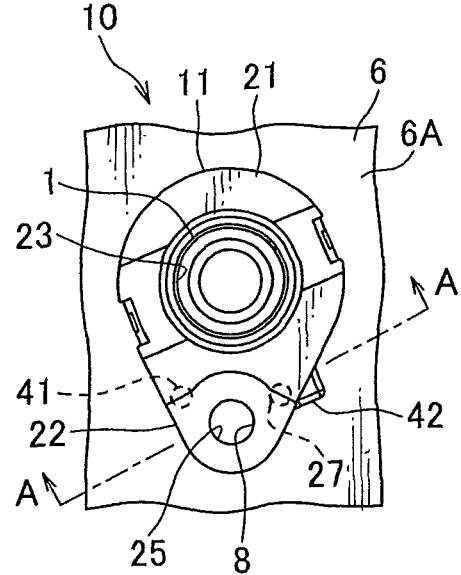
FIG. 5B is an elevational view illustrating operation of the improper connection prevention structure.
Figure 6A:
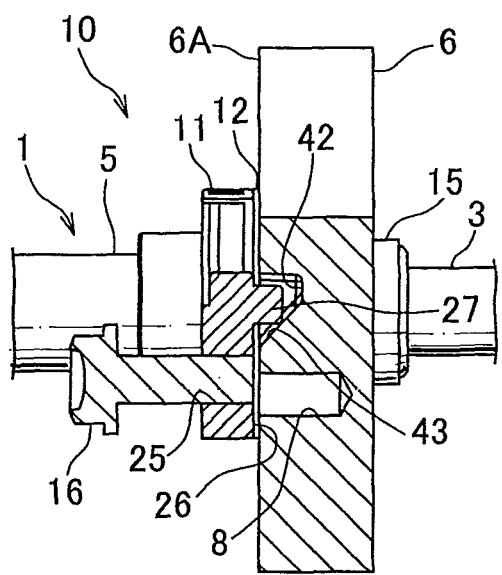
FIG. 6A is a cross-sectional view illustrating operation of the improper connection prevention structure following what is in FIG. 5A.
Figure 6B:
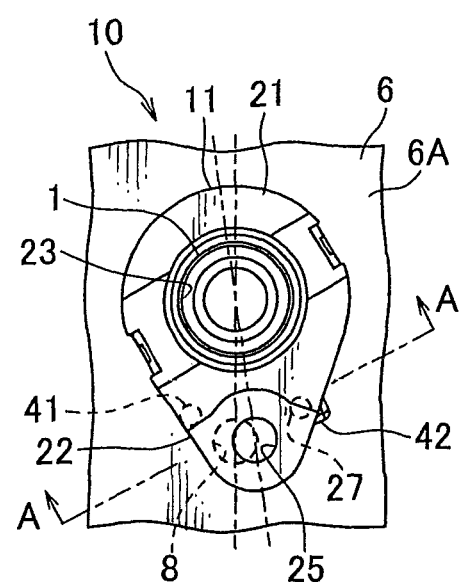
FIG. 6B is an elevational view illustrating operation of the improper connection prevention structure following what is in FIG. 5B.
Figure 9A:
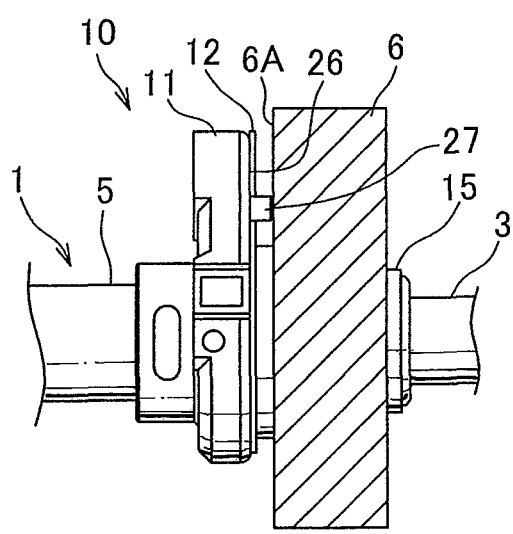
FIG. 9A is a cross-sectional view illustrating operation of an improper connection prevention structure according to the conventional art.
Figure 9B:
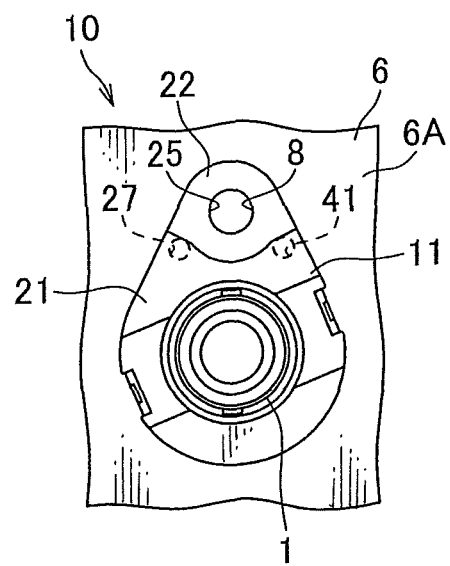
FIG. 9B is an elevational view illustrating operation of the improper connection prevention structure according to the conventional art.

On the other hand, when the shield electric wire for P-electrode 1A attached to the housing 11A is made inserted into the insertion hole 7B, or the shield electric wire for N-electrode 1B attached to the housing 11B is made inserted into the insertion hole 7A, namely, the shield electric wire 1 of improper combination, as shown in FIGS. 5A, 5B, is inserted into the insertion hole 7 of the metal case 6, the pin 27 (the first pin 27A or the second pin 27B) cannot be inserted into the positioning hole 41 (the first positioning hole 41A or the second positioning hole 41B), and is thus abutted onto the slant face 43 (the first slant 43A or the second slant 43B) of the recess 42 (the first recess 42A or the second recess 42B). Accordingly, when the housing 11 (the housing 11A or the housing 11B) is, with the pin 27 abutted onto the slant face 43, intended to be fixed, as shown in FIGS. 6A, 6B, the pin 27 is abutted onto along the slant face 43 and the housing 11 pivots about the electric guide 23 and the insertion hole 7. Thus, rotation of the housing 11 makes the through hole 25 and the bolt hole 8 rotate respectively in a peripheral direction, disabling the bolt 16 inserted into the through hole 25 threading to the bole hole 8. Therefore, disability of the housing 11 being fixed to the metal case 6 and possibility of the operator finding the improper connection prevents the shield electric wire 1 from improperly connecting.

As procedure of setting the shield electric wire 1 to the metal case 6, firstly, the outer insulating cover 5 in the tip of the shield electric wire 1 cut by predetermined length is peeled so as the shield part 4 is exposed, and the tip is subsequently inserted into the housing 11, the first seal member 13, and the shield member 12. Then toward the tip of the shield electric wire 1 the housing 11 is moved, the first seal member 13 is fitted in between the first seal member 13 and the third tubular part 33 of the seal member 12; and the housing main body 21 and the fixing part 22 of the housing 11 are abutted onto the flange 36 of the shield member 12. The second seal member 14 is then put from the tip of the shield electric wire 1 on the second tubular part 32 of the shield member 12. Then, the shield member 4 of the shield electric wire 1 is turned and stacked outside the first tubular part 31 of the shield member 12, and the shield pipe 5 stacked outside the shield part 4 is swaged to fix the shield member 12 to the tip of the shield electric wire 1. Furthermore, to the conductor 2 in which the inner insulating cover 3 is peeled to be exposed the terminal 9 is left crimped.

Figure 2:
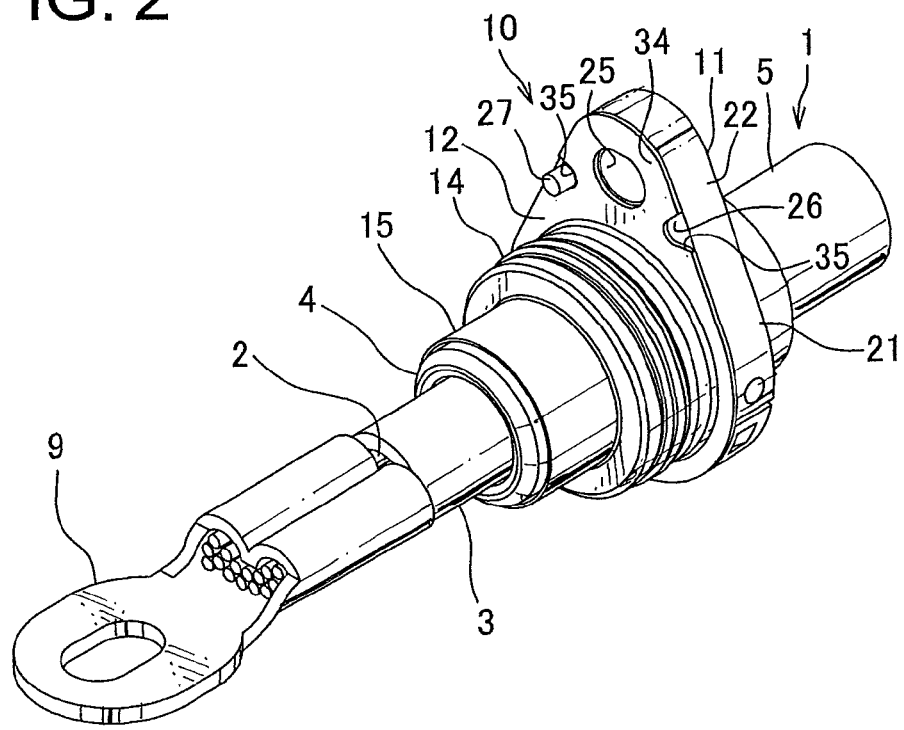
FIG. 2 is a perspective view illustrating a shield electric wire in the shield connector structure.
Figure 3:
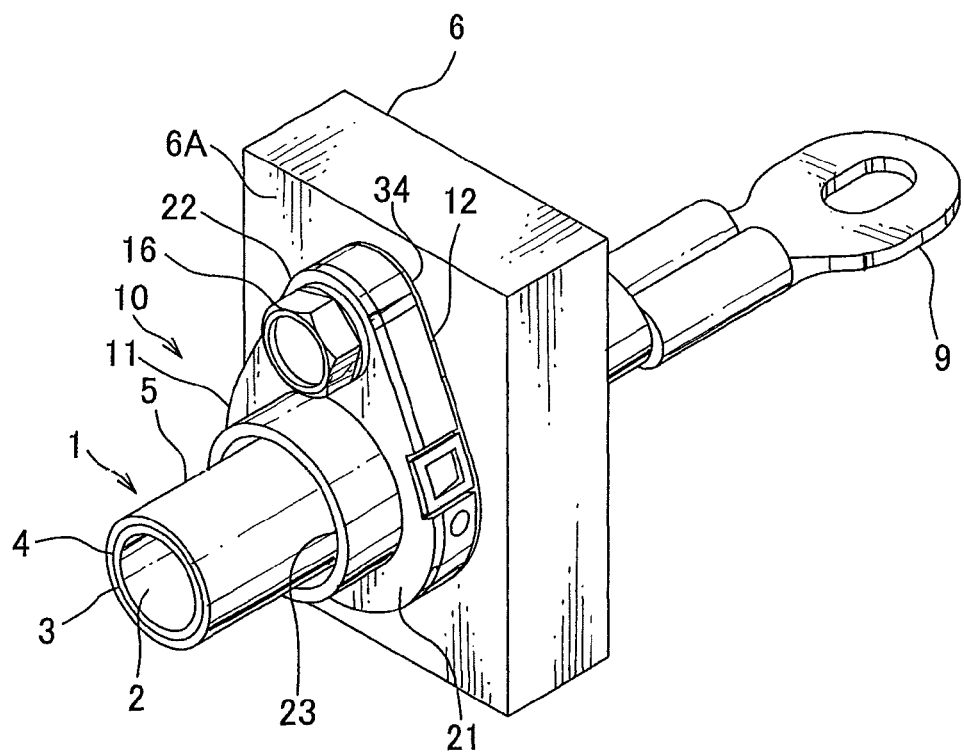
FIG. 3 is a perspective view illustrating the shield connector structure viewed from one side of a connection object.

Thereby, as shown in FIG. 2, to the tip of the shield electric wire 1 the housing 11, shield member 12, the first shield member 13, the second seal member 14, and the shield pipe 15 are attached, and the shield electric wire 1 in this condition is inserted from the side of the terminal 9 into the insertion hole 7 of the metal case 6. At this time as mentioned above, when the shield electric wire 1 of the improper combination is inserted into the insertion hole 7 of the metal case 6, respective rotation of the through hole 25 and the bolt hole 8 in peripheral direction disables the bolt 16 from threading into the bolt hole 8, making the operator who has found improper connection retreat connection. On the other hand since when the shield electric wire 1 of proper combination is inserted into the insertion hole 7 of the metal case 6, the bolt that is made inserted into the through hole 25 of the housing 11 can be threaded into the bolt hole 8 of the metal case 6, the flange 36 of the shield member 12 is nipped between the opposite face 26 of the housing 11 and the outer face 6A of the metal case 6 and the housing 11 is fixed to the metal case 6, and thus the shield member 12 is connected to the metal case 6, completing assembling of the shield electric wire 1.

According to the aforementioned discussion, when the shield electric wire 1 of the improper combination is inserted into the insertion hole 6 of the metal case 6, by function of the pin 27 projecting toward the opposite face 26 of the housing 11, the positioning hole 41 and recess 27 disposed on the outer face 6A of the metal case 6, improper combination can be found, and disablement of the bolt 16 threading disables the housing 11 from being fixed to the metal case 6, and thus it is made possible to securely prevent improper connection of the shield electric wire 1. When the shield electric wire 1 of proper combination is inserted into the insertion hole 7 of the metal case 6, the pin 27, on the other hand, is inserted into the positioning hole 41 to position the housing 11 and enablement of the bolt 16 inserted into the through hole 25 threading into the bolt hole 8 allows work for fixing the housing to perform smoothly and prevents workability for the connection work of the shield electric wire 1 from being impaired.

Note that in the aforementioned embodiment, although coaxial cable is illustrated as the shield electric wire 1, shield connector in the case of connecting shield electric wire having a conductor made of a plurality of conductors can be available for the invention, and in this case shield member, the first seal member, the second seal member, protrusion of the housing and the like may be formed tubular in cross-sectionally ellipsoidal or oval shape. As connecting objects, not limited to motors, invertors or batteries employed in electric vehicles or hybrid vehicles, other any electric devices may be used, or electric connection boxes provided therein with electric components may be used. As objects for ground-connection with shield electric wire not limited to the metal case 6, parts disposed for ground connection may be used.

Furthermore, in the aforementioned embodiment, while on the opposite face 26 of the housing 11 the pin (projecting) 27 is formed and on the outer face 6A of the metal case 6 the positioning hole 41 and the recess 42 are formed, but not limited to this case, on the opposite face 26 of the housing 11 the positioning hole 41 and the recess 42 may be formed, and on the outer face 6A of the metal case 6 the pin (projecting) 27 may be formed. Furthermore, in the aforementioned embodiment, while discussed is the improper connection prevention structure for the shield electric wires 1A and 1B which are each connected to two electrodes (P-electrode and N-electrode) of direct current source, the shield electric wire of the present invention, as shown in FIGS. 7A, 7B and 7C, is available for three types of shield electric wires 1A, 1B and 1C which are each connected to three-phase alternating-current source, for example. In particular, the improper connection prevention structure, besides the first housing 11, the second housing 11B similar to the aforementioned embodiment, as shown in FIG. 7C, is provided with a third housing 11C attached to the shield electric wire 1C. On an opposite face 26 of the third housing 11C is provided with a third pin 27C as a projection arranged differently from the first pin 27A and the second pin 27B.

On the other hand, as shown in FIG. 7C, on the outer face 6A of the metal case 6 around the insertion hole 7C for the shield electric wire 10 is formed a third positioning hole 41C at a position corresponding to the third pin 27C. Furthermore, around the insertion hole 7C is formed a third recesses 42C at position corresponding to the first pin 27A of the first housing 11A and the second pin 27B of the second housing 11B, respectively, and in the third recess 42C a third slant face 43C is formed. As shown in FIGS. 7A and 7B, on the outer face 6A around the insertion holes 7A and 7B for shied electric wires 1A and 1B, besides the first and second positioning holes 41A and 41B and the first and second recesses 42A and 42B, at the position corresponding to the third pin 27C a forth recess 44 is formed, in which a forth slant face 45 is formed.

According to such the improper connection prevention structure, besides the aforementioned embodiment, when the shield electric wire 1A is inserted into the insertion hole 7C, or the shield electric wire 1B is inserted into the insertion hole 7C, the first pin 27A or the second pin 27B is abutted onto the third slant face 43C of the third recess 42C, and thus the housings 11A and 11B are rotated. When the shield electric wire 10 is inserted into the insertion hole 7A or the insertion hole 7B, the third pin 27C is abutted onto the forth slant face 45 of the forth recess 44, and thus the housing 11 is rotated. Thus, in the case of improper combination even for three types of shield electric wires 1A, 1B and 1C, rotation of the housing 11 disables the bolt 16 from threading into the bolt hole 8, preventing the shield electric wire 1 from connecting improperly. Note that from the above discussion, for improper connection prevention structure for even more than four types of shield electric wires 1, it is understood that arrangement of pins (projections) 27, positioning holes 41 and recesses 42 of suitable number and at suitable position can prevent improper connection for the shield electric wire 1.

REFERENCE SIGNS LIST 1 shield electric wire
2 conductor
3 inner insulating cover
4 shield part 5 outer insulating cover
6 metal case (connecting object)
6A outer face (one face)
7 insertion hole
8 bolt hole
10 shield connector
11 housing
11A first housing
11B second housing
12 shield member
25 through hole
26 opposite face
27 pin (projection)
27A first pin (first projection)
27B second pin (second projection)
35 notch
41 positioning hole
42 recess
43 slant face

The invention claimed is:

1. A shield connector structure for connecting a shield electric wire with a connection object by passing through the shield electric wire from one end to another end of an insertion hole of the connection object, which the shield electric wire includes a conductor, an inner insulating cover, a shield part, and an outer insulating cover, the shield connector structure comprising:
 a housing passing therethrough the shield electric wire and fixed to one face of the connection object and including an opposite face facing the one face of the connection object and a through hole;
 a shield member electrically connecting the shield part of the shield electric wire and the connection object; and
 a bolt passing through the through hole and fixing the housing to the connection object by the bolt passing through the housing and threading into a bolt hole of the connection object,
 wherein one of the one face of the connection object and the opposite face of the housing is provided with a projection projecting toward another one face of the connection object and the opposite face of the housing,
 wherein the another one face of the connection object and the opposite face of the housing is provided with a positioning hole receiving the projection with the bolt operable to thread into the bolt hole and a recess recessed from the one face of the connection object or the opposite face of the housing,
 wherein the recess includes a slant face along a circumferential direction about a center axis of the insertion hole of the connection object and slanted in a recess direction, and
 wherein upon improper combination of the connection object and the housing, abutting of the projection onto the slant face allows the bolt hole of the connection object and the through hole of the housing to rotate about the center axis.

2. The shield connector structure as claimed in claim 1, wherein the housing includes a tubular electric wire guide passing therethrough from one end of the housing to another end of the housing thereof the shield electric wire and extending into the insertion hole of the connection object, and the housing is composed of either a first housing passing through a predetermined type of the shield electric wire or a second housing passing through a different type of the shield electric wire from the predetermined type, and
wherein
on an opposite face of the first housing is formed
 a first projection as the projection deviating-from a line connecting centers of the electric wire guide and the through hole to one side when the opposite face is viewed, on the opposite face of the second housing is formed
 a second projection as the projection deviating from the line connecting centers of the electric wire guide and the through hole to another side opposite to the first projection when the opposite face is viewed, and on the one face of the connection object are formed
 the positioning hole and
 the slant face of the recess at line-symmetry positions when the one face of the connection object is viewed crossing the line connecting centers of the insertion hole and the bolt hole, or
on the opposite face of the first housing are formed
 the positioning hole on one side of line-symmetry sides when the opposite face is viewed crossing the line connecting centers of the electric wire guide and the through hole and
 the slant face of the recess on the other side of line-symmetry sides, on the opposite face of the second housing are formed
 the slant face of the recess on one side of line-symmetry sides when the opposite face is viewed crossing the line connecting centers of the electric wire guide and the through hole and the positioning hole on the other side of line-symmetry sides, and
on the one face of the connection object is formed
 the projection deviating from the line connecting centers of the insertion hole and the bolt hole.

3. The shield connector structure as claimed in claim 1, wherein the shield member is placed between the one face of the connection object and the opposite face of the housing so as to be electrically connected to the connection object and is configured to form therein a pair of notches passing therethrough both the projection and the projection of improper combination.

4. The shield connector structure as claimed in claim 2, wherein the shield member is placed between the one face of the connection object and the opposite face of the housing so as to be electrically connected to the connection object and is configured to form therein a pair of notches passing therethrough both the projection and the projection of improper combination.

* * * * *